United States Patent [19]

Barnett et al.

[11] Patent Number: 4,967,162

[45] Date of Patent: Oct. 30, 1990

[54] STRIPLINE TRAVELING WAVE DEVICE AND METHOD

[75] Inventors: Larry R. Barnett, Westminster, Colo.; Robert M. Phillips, Redwood City, Calif.

[73] Assignee: Star Microwave, Campbell, Calif.

[21] Appl. No.: 149,375

[22] Filed: Jan. 28, 1988

[51] Int. Cl.⁵ .............................................. H03F 3/58
[52] U.S. Cl. ...................................... 330/43; 330/49
[58] Field of Search .................. 330/43, 45, 49, 53, 330/54; 331/82; 315/3.5, 39.3

[56] References Cited

U.S. PATENT DOCUMENTS

| | | | |
|---|---|---|---|
| 2,647,175 | 7/1953 | Sheer | 330/49 |
| 2,654,004 | 9/1953 | Bailey | 330/49 X |
| 3,755,704 | 8/1973 | Spindt et al. | 313/336 X |
| 4,091,332 | 5/1978 | Crandall | 330/43 |

Primary Examiner—James B. Mullins
Attorney, Agent, or Firm—Flehr, Hohbach, Test, Albritton & Herbert

[57] ABSTRACT

A traveling-wave device for amplification of RF signals at microwave frequencies, primarily from UHF to sub-millimeter wavelengths, comprised primarily of broad-coupled parallel striplines of which one is a cathode stripline and the other a non-intercepting gate stripline disposed between conducting plates. Electrons are emitted from the cathode stripline and accelerated by DC electric fields through the non-intercepting gate stripline on which the microwave signal is propagating in a transmission mode which has reversed directions of the microwave electric field on each side of the gate stripline. The odd mode component of the microwave electric field, between the gate stripline and cathode stripline, serves to modulate and/or stimulate electron emission from the cathode stripline and the reversed direction of the microwave electric field between the gate stripline and the conducting plate decelerates the electrons to add their energy to the propagating wave for amplification. Positive feedback, due to the coupling of the growing RF propagating wave of the stripline system to the odd mode modulating signal, gives the amplifier large and continuous exponential gain.

25 Claims, 9 Drawing Sheets

FIG.—1

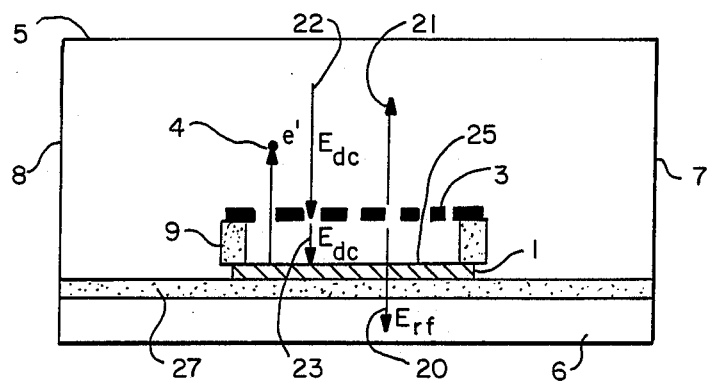
FIG. —5
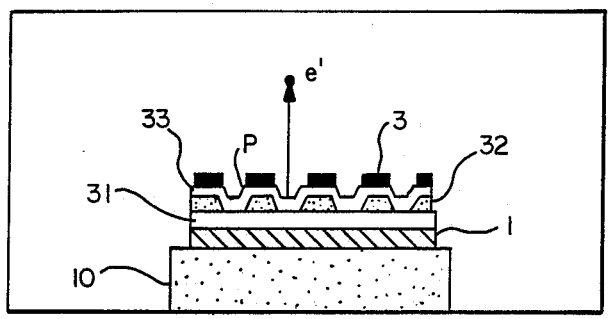
FIG. —6
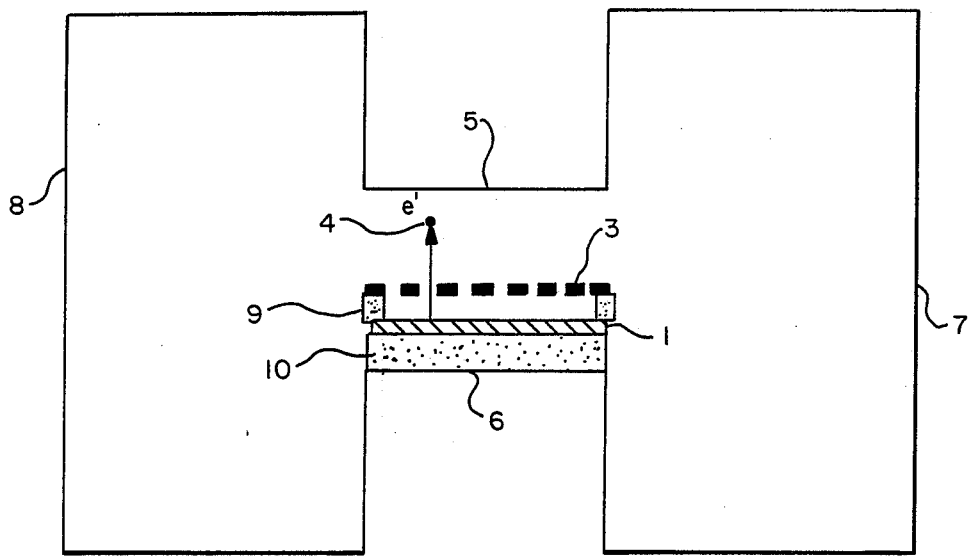
FIG. —7

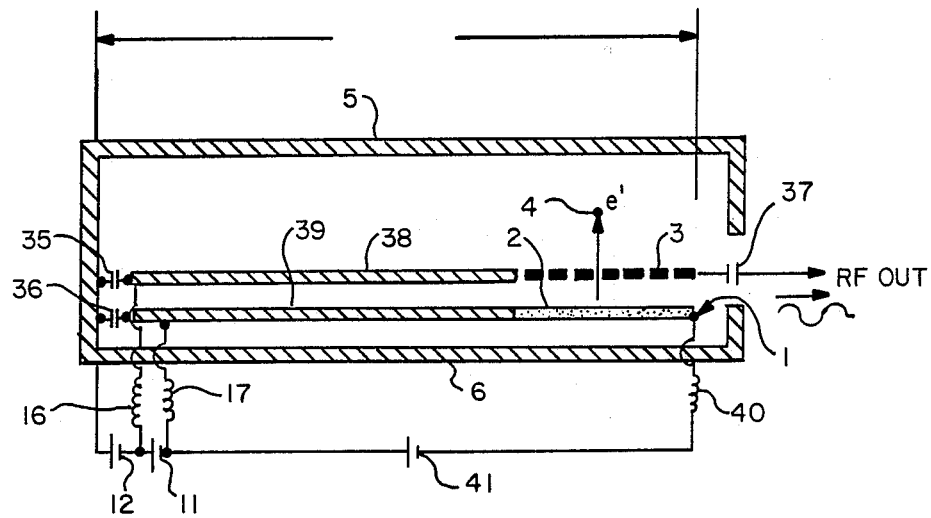
FIG. — 13
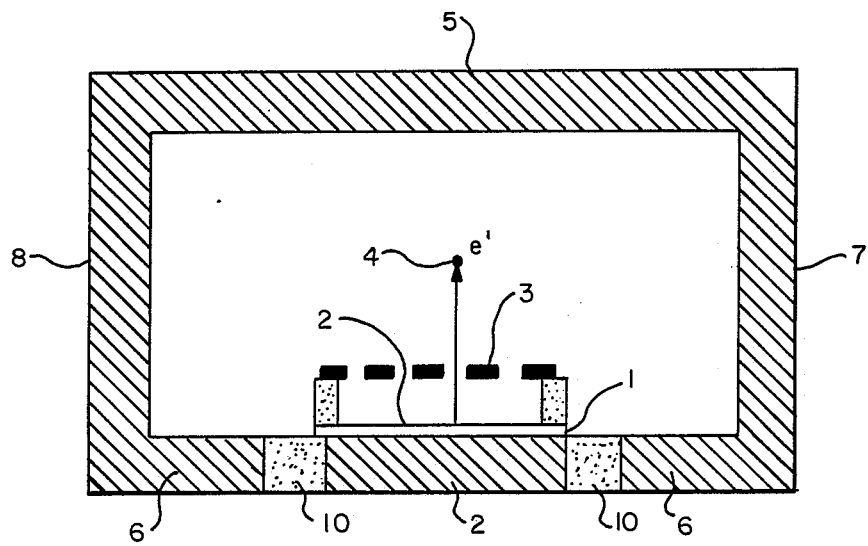
FIG. — 14

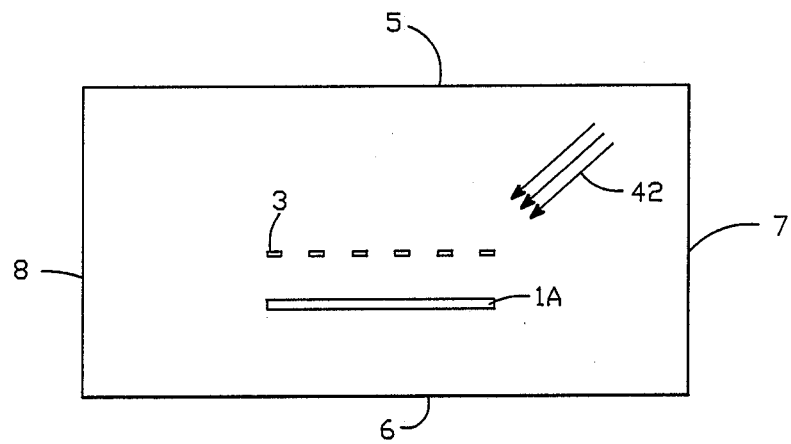
FIG.—17
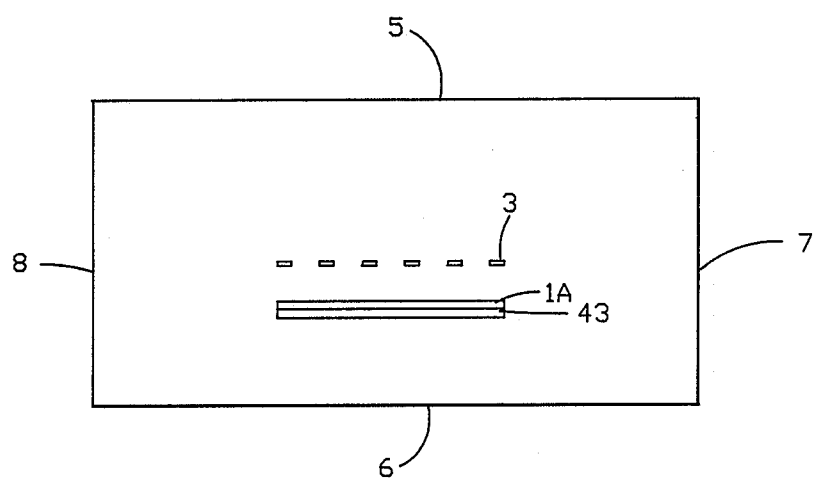
FIG.—18

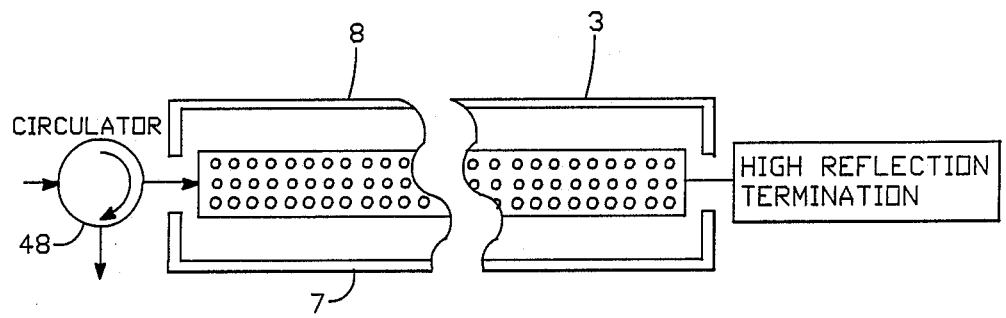
FIG.—19
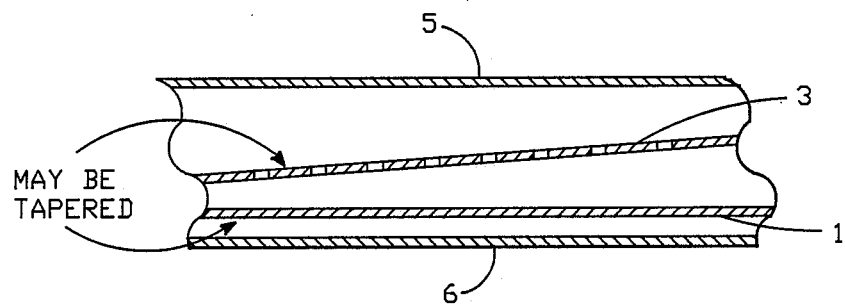
FIG.—20
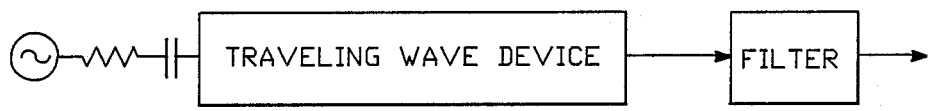
FIG.—21

STRIPLINE TRAVELING WAVE DEVICE AND METHOD

BACKGROUND OF THE INVENTION

This invention relates generally to high frequency microwave frequency amplifiers and more particularly to a stripline microwave traveling wave device and method.

There exists a great need for amplifiers at microwave signals particularly millimeter and submillimeter wave frequencies for communications, radar, scientific studies and other applications. Some needs are for small signal amplifiers such as in receivers where not very much output power is needed. There are needs for higher power amplifiers such as those used for transmitters, sources, etc. While there is currently a great variety of amplifiers there is a constant need to make them smaller, lighter, more powerful, more efficient, lower voltage, higher gain, wider bandwidth, lower noise, more rugged, longer-lifed, lower cost, etc.

Current traveling-wave tubes generate high voltage electron beams (usually several kilovolts to many tens of kilovolts) which travel adjacent periodic slow-wave circuits which carry the signals with the signal electric fields coupled to the electron beam whereby energy is transferred from the beam to the traveling signal wave. Slow wave circuits are usually helix or coupled-cavity circuits. An axial magnetic field is normally required to focus and confine the electron beams. The high voltage and magnetic field required contribute substantially to size and weight of the tube. As the frequency of operation is increased the requirement of high voltage and magnetic field strength increases. As the frequency is increased the slow-wave circuit becomes smaller and at even low millimeter wave frequencies the circuits become difficult and expensive to manufacture. For that reason there are very few practical amplifiers which operate above about 100 GHz. Oscillators are generally used because oscillators are generally simpler in construction and less expensive to manufacture.

The present invention makes use of an entirely different principle in which electrons are emitted from a cathode stripline accelerated by a DC voltage, and simultaneously modulated by the electric field of the microwave signal traveling along a gate stripline. The electrons give up their energy to the RF electric field which has reversed in direction at the gate stripline. A positive feedback from the growing wave to the modulating signal contributes to the amplifier having a large and continuous exponential gain. This traveling wave amplifier requires no magnetic field or periodic slow-wave structure and operates at low voltage. In addition, it is very small and can be constructed using solid state type integration techniques.

By simply taking a small piece or section of a traveling-wave amplifier with appropriate connections such as high-reflection terminations at the ends to create a standing wave, or simply using a piece or section in a cavity, oscillators can be constructed.

SUMMARY OF THE INVENTION

An object of the present invention is to provide a stripline traveling-wave amplifier.

It is another object of the invention to provide a traveling-wave stripline amplifier which is very small in size.

It is a further object of the present invention to provide an amplifier which uses simple wave propagating circuits and eliminates the need for periodic slow-wave circuits.

It is another object of the invention to provide an amplifier that does not require magnetic fields or high voltage.

Still a further object of the invention is to provide a traveling wave stripline oscillator.

Another object is to provide a method of amplifying waves which travel along a stripline structure by use of transverse electron flow.

These and other objects and advantages are provided by an RF traveling-wave amplifier which includes broad-coupled parallel striplines, a cathode or electron emitting stripline and a non-intercepting gate stripline disposed between conducting plates. Electrons are emitted from the cathode stripline and accelerated by a DC electric fields through the non-intercepting gate stripline on which the microwave signal is propagating in a transmission mode with microwave electric fields extending from the gate stripline to the parallel plates each side of the gate stripline. The portion of the microwave electric field between the gate stripline and cathode stripline serves to stimulate and/or modulate electron emission from the cathode stripline, and the reversed direction of microwave electric field between the gate stripline and the opposite parallel plate decelerates the electrons which add their lost energy to the propagating wave for amplification. Positive feedback due to the coupling of the growing RF propagating wave of the stripline system to the odd mode modulating signal gives the amplifier large and continuous exponential gain.

BRIEF DESCRIPTION OF THE DRAWINGS

The foregoing and other objects of the invention will be more clearly understood from the following description and the accompanying drawings of which

FIG. 5 is a cross-section of another embodiment having a thermionic emission type of emitter.

FIG. 6 is a cross-section of another embodiment of the present invention having a solid-state type emitter.

FIG. 7 is a schematic illustration of an embodiment of the present invention which employs a stripline having a double-ridged geometry.

FIG. 13 shows an oscillator in accordance with the present invention.

FIG. 14 is an illustration of an embodiment of the present invention in which the RF voltage dividing gap is located differently.

FIG. 17 shows a traveling wave device including a photoemitter cathode stripline activated by impinging light.

FIG. 18 shows a traveling wave device including a photoemitter cathode stripline activated by a light emitting source.

FIG. 19 shows a traveling wave device including a reflective termination and an input circulator.

FIG. 20 shows a traveling wave device having tapered spacing of the striplines.

FIG. 21 shows a traveling wave device connected to a frequency filter.

DETAILED DESCRIPTION OF THE PREFERRED EMBODIMENTS

Figure 1:
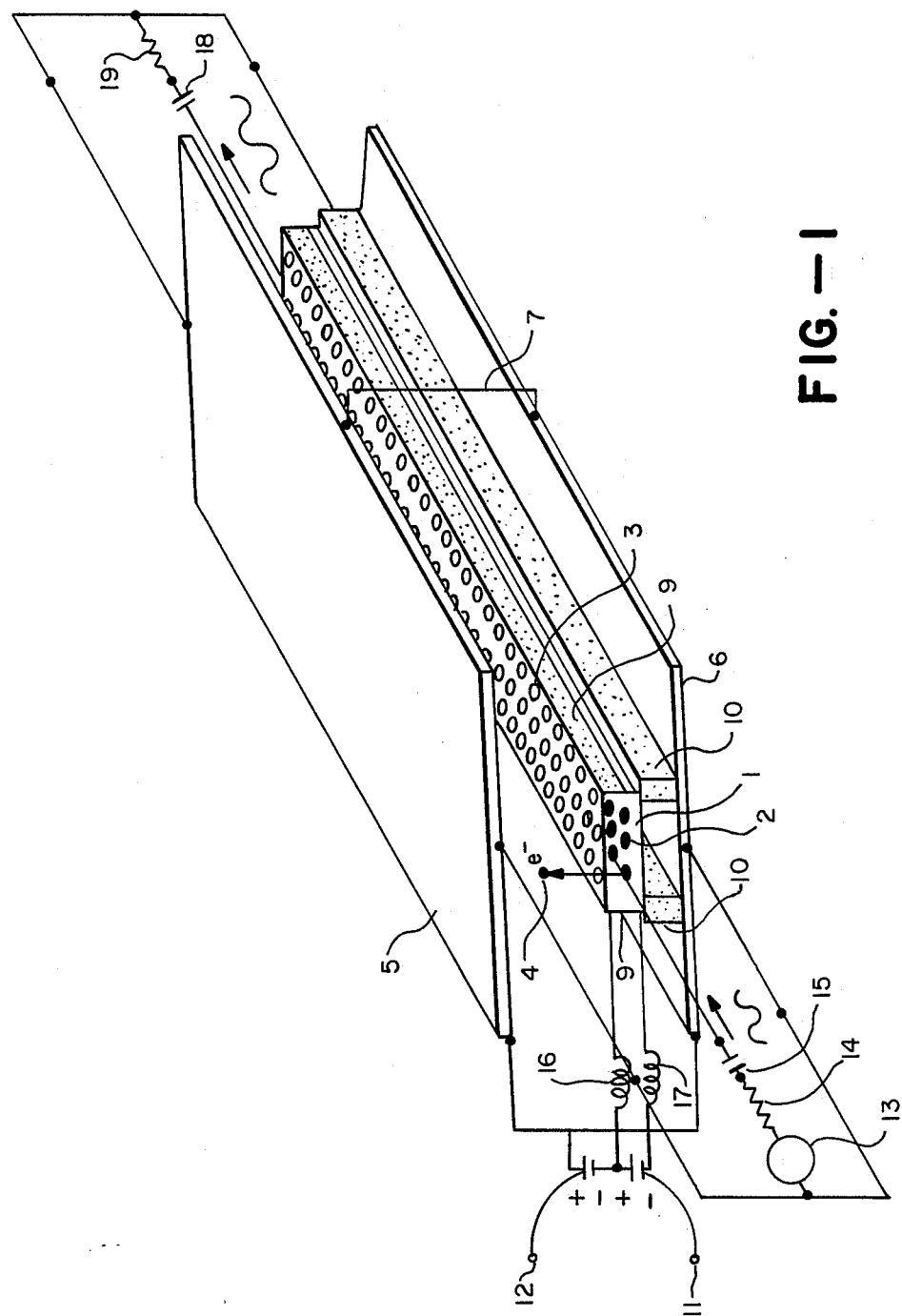
FIG. 1 is a schematic illustration of a stripline traveling wave device in accordance with one embodiment of the invention.
Figure 2:
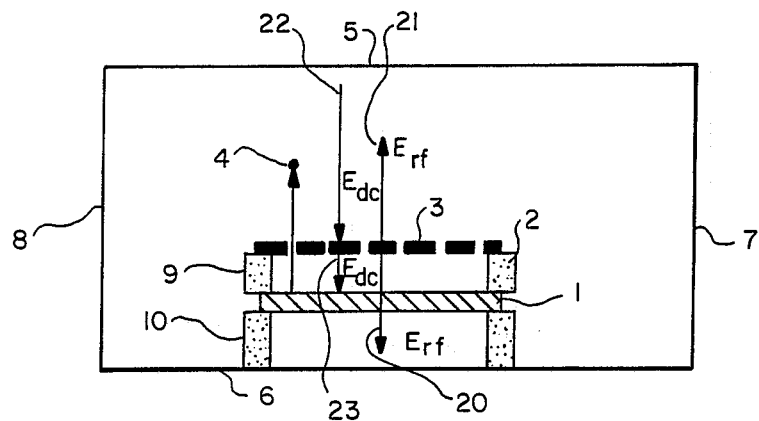
FIG. 2 is a cross-section of FIG. 1 taken along the line 2—2 of FIG. 1.

FIGS. 1 through 8 and FIG. 14 illustrate embodiments of a stripline traveling-wave tube amplifier. Throughout the description to follow reference numbers have been applied to like parts. Referring to FIG. 1, the amplifier consists of a cathode stripline which comprises a strip conductor which can be a metal or a heavily-doped semiconductor for good electrical conductivity provided with an electron-emitting surface 2 either covering one surface or disposed in spots, strips, etc. on the side facing the gate stripline 3. Gate stripline 3 comprises a strip conductor with holes, slots, or other shapes of apertures (or an actual "grid" of fine wires) for passage of electrons with minimal interception as will be presently described. Spaced conducting strips or plates 5 and 6 have a width at least equal to the striplines 1 and 2 but normally much greater. Conducting plates 5 and 6 are preferably electrically connected by conducting side walls 7 and 8 as shown in FIG. 2. The electrical connection made by walls 7 and 8 are schematically represented by connection 7 in FIG. 1. The assembly also includes end walls not shown to define with the plates 5 and 6 and walls 7 and 8 an envelope. If walls 7 and 8 are not included then an additional vacuum envelope must be supplied. The tube is evacuated to the degree required for the cathode emitter in use.

The striplines are biased with respect to the plates 5 and 6 by DC power supplies 11 and 12 connected to the striplines by feedthrough connectors, now shown. The microwave signal on the striplines is isolated from the power supply connections with RF chokes which can take many forms as well known in the art, represented by the inductors 16 and 17 in FIG. 1. The striplines 1 and 3 are separated by a small gap most easily maintained by a dielectric support 9 which can consist of longitudinal dielectric strips supporting the edges, as shown: by transverse dielectric strips or by a dielectric member with the same aperture pattern as gate stripline 3 for passage of the electrons.

Figure 4:
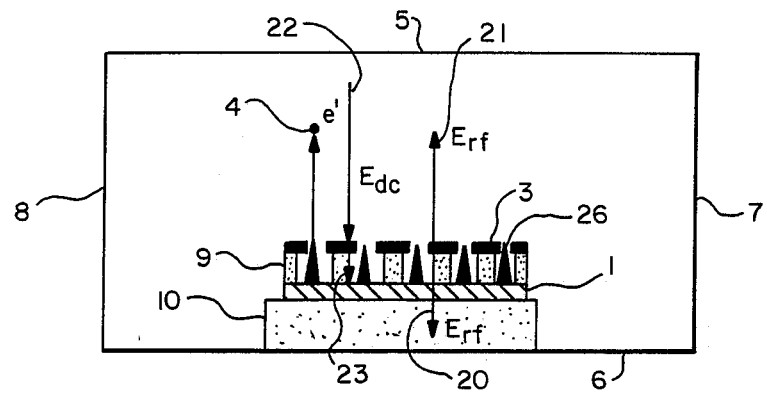
FIG. 4 is a cross-section of still another embodiment of the present invention having a "Spindt" field emission type emitter.

Cathode strip 1 is supported from the conducting plate 6 by dielectric strips 10. The dielectric 10 can also be a continuous solid support between stripline 1 and plate 6, as illustrated in FIG. 4 and 6. For maximum gain and efficiency of the amplifier the dielectric supports should be of low RF loss material and provide minimal loading of the microwave fields by minimizing the amount of dielectric between the striplines 1 and 3, and plate 6, and/or by using a dielectric of low permittivity. Useful dielectric materials are alumina, beryllia, silicon dioxide, diamond, and semiconductors such as silicon, galliumn arsenide, etc. that have very low doping and impurity levels as to be good dielectrics.

The microwave signal is injected, as shown schematically in FIG. 1 from a microwave source represented by an ideal voltage oscillator 13 in series with the source impedance 14, through the end of the assembly by a feed through, not shown, and connected to the gate stripline 3. A DC blocking capacitor 15 in the input circuit of microwave source prevents the DC bias source 12 from being shorted or drained by the microwave input source.

Techniques for launching RF signals onto the gate stripline 3 from coaxial lines, waveguides, etc. are well known in the art. The microwave signal thus launched propagates down the stripline structure and is amplified via the mechanism to be described. The amplifier output signal is coupled out va a connection to the gate stripline, at the opposite end of the amplifier, through a DC blocking capacitor to the load as represented by load resistor 19.

FIG. 2 is a cross-section of FIG. 1 as if looking down the amplifier in the direction of propagation of the microwave signal. The instantaneous RF electric fields, $E_{rf}$, represented by arrows 20 and 21 extend from the gate stripline 3 to the plates 5 and 6 (3 to 1 and 1 to 6). The DC electric field, $E_{dc}$, established by bias supplies 11 and 12, are represented by arrows 22 and 23 in the regions between cathode stripline 1 and plate 6. The DC electric field between stripline 1 and plate 6 does not contribute to the process of amplification as electrons do not travel in that region.

The details of the amplification mechanism of the present invention will now be described with reference to FIGS. 1 and 2. A microwave signal is launched by applying the signal to gate stripline 3 as illustrated in FIG. 1. This establishes instantaneous RF electric fields in opposite directions on each side of the gate stripline 3, as shown by arrows 20 and 21, FIG. 2. The instantaneous RF potential of cathode stripline 1 with respect to plate 6 is some fraction of the instantaneous RF potential of stripline 3 to plate 6. The instantaneous RF electric field on each side of cathode stripline 1 is in the same direction although the magnitudes may be different. The propagation of the microwave signal down the striplines is understood in terms of even and odd modes as well known in the art for broad-coupled striplines. The even mode exists when the instantaneous RF potential between the gate stripline 3 and the plates 5 and 6 are in phase and of equal voltage amplitude. The odd mode exists when the instantaneous RF potential between the gate stripline 3 and the plates 5 and 6 are 180 degrees out of phase and of equal voltage amplitude. Any other condition of phase and/or unequal voltage amplitude results in both mode existing and propagating. As can be seen from the explanation of the fields of the injected microwave signal both even and odd modes are excited. As well known in the art, even and odd modes can be propagate at different phase velocities. In order to maintain the desirable phase relationship of the field, along the entire length of the amplifier that was initially correct at the launch, the condition which maximizes the gain of the amplifier, the even and odd modes must be made to propagate at the same phase velocity over the frequency range of interest. It is well known in the art that the odd mode phase velocity is sensitive to dielectric loading between the two striplines (as this is where most of the energy is stored in that mode), and that the even mode phase velocity is sensitive to dielectric loading outside the two striplines since that is where the energy is stored in that mode (no field between the striplines). Therefore, it is possible to adjust the phase velocity of the two modes to be equal by appropriately choosing the amounts of dielectric and the permittivities.

In stripline geometries below cutoff of higher order TE and TM modes, the even and odd modes of propagation with no dielectrics (i.e., vacuum with relative permittivity $E_r = 1$) are TEM with phase velocities $V_p = C$ (speed of light in vacuum). In the preferred embodiments of the present invention where dielectric supports are required then the phase velocities of the even and odd modes are given by $$V_{pc} = C/\sqrt{\epsilon_{re}}$$

$$V_p = C/\sqrt{\epsilon_{ro}}$$

where $E_{re}$ is the effective dielectric constant of the even mode and $E_{ro}$ is the effective dielectric constant of the odd mode. Therefore, $$E_{re} = E_{ro}$$

then $V_{pc} = V_{po}$.

In FIGS. 1 and 2, for example, the effective dielectric constants can be adjusted by selection of dielectric material of supports 9 and 10, and by varying the widths of dielectric supports 9 and 10, therefore making the phase velocities equal. From this point in the description both modes are assumed to be phase velocity matched at phase velocity $$V_p = C/\sqrt{\epsilon_r}$$

where $E_r$ is the effective dielectric constant of the system. If the width of supports are made very thin then $E_r \approx 1$ and $V_p \approx C$. Other embodiments are possible that utilize per slow-wave circuits or fast-wave circuits (TE or TM modes) but since they are much more complex than the preferred embodiments described here they will not be described.

The gate stripline 3 is DC biased positive with respect to cathode stripline 1 such that cathode current is emitted. This is equivalent to the Class A biasing of a vacuum triode or solid state transistor. As cathode stripline 1 has an electron emitting surface 2, electrons 4 will be emitted, according to the laws of emission, for the particular emitter in use. The electrons are accelerated by the DC fields, $E_{dc}$ through the gate stripline to the conducting plate 5 which is also used as the electron collector in this embodiment. The current density of emission is strongly dependent on the instantaneous electric field between striplines 1 and 3 and, hence, strongly dependent on the instantaneous voltage between striplines 1 and 3.

Figure 10:
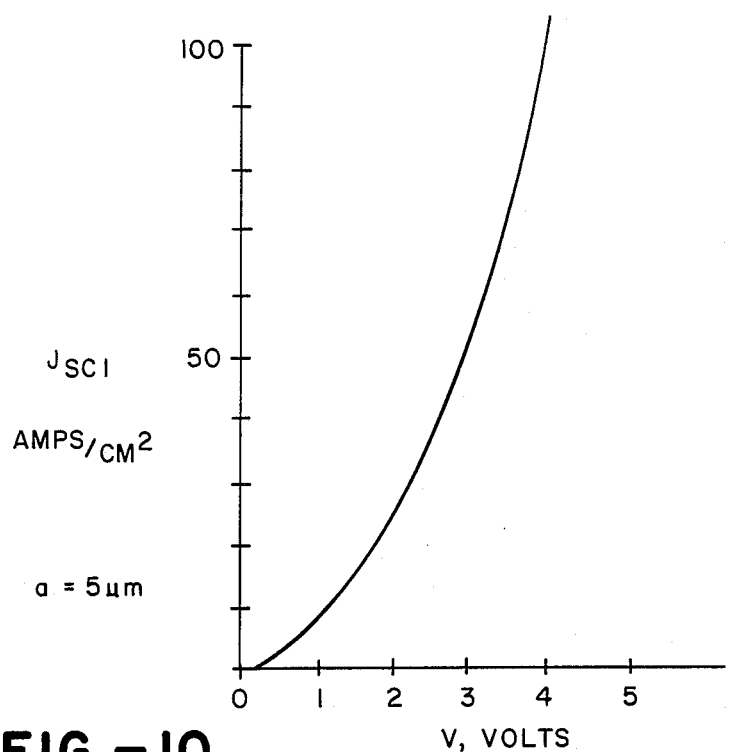
FIG. 10 is a graph showing the current density as a function of voltage for a space-charge limited emitter.
Figure 11:
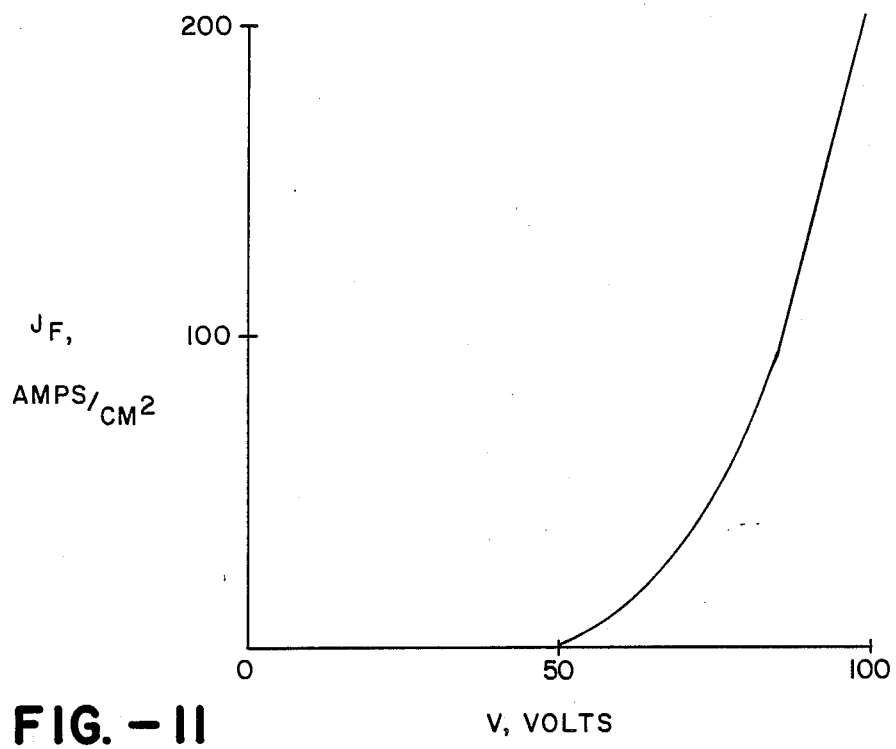
FIG. 11 is a graph showing the current density as a function of voltage for a field-emission emitter.

FIGS. 10 and 11 illustrate two examples of current emission density J as a function of voltage for space-charge limited emission and for field emission. Hence, when a microwave RF electric field is applied the RF voltage adds to the DC voltage such that when the instantaneous RF electric field is in a phase it increases the total electric field and the current density J of electron emission increases, and when the instantaneous RF electric field opposes the DC field then the current density of emission decreases. In other words, the odd-mode traveling-wave signal modulates the emission current. The RF component of modulated emission current travels with the wave at the same phase velocity even though the actual direction of electron flow is transverse to the wave. This is fundamentally different from ordinary traveling-wave tubes in which the electrons flow in the same direction as the traveling wave.

When the instantaneous electric field is enhancing current flow, the microwave signal is adding energy to the electrons in the region between striplines 1 and 3. The electrons travel through the grid stripline where they come under the influence of an RF electric field that is reversed (or 180 degrees out of phase). The RF voltage between gate stripline 3 and plate 5 is higher than between gate stripline 3 and cathode stripline 1 and the electrons lose more energy to the RF field between gate stripline 3 and plate 5 than they had gained from the RF field between cathode stripline 1 and gate stripline 3. The RF voltage is higher from gate stripline 3 to plate 5 than from cathode stripline 1 to gate stripline 3 because of the gap between cathode stripline 1 and plate 6 which also has RF electric field; i.e., the instantaneous RF voltage from gate stripline 3 to cathode stripline 3 plus the voltage from cathode stripline 1 and plate 6 equals the instantaneous RF voltage between gate stripline 3 and plate 5. The voltage drop between cathode stripline 1 and plate 6 is thus essential.

The gap can be located elsewhere other than as shown, the purpose of the gap being to reduce the RF voltage between cathode stripline 1 and gate stripline 3 relative to that between gate stripline 3 and plate 5 for positive energy transfer, and to permit coupling from the growing wave back to the modulating signal for continuous exponential gain.

FIG. 14 illustrates how the gap could be located at the edges of cathode stripline 1. Gap dimensions and gap dielectric 10 in FIG. 14 are chosen so as to give the same capacitance per unit length of stripline and the same effective dielectric constant as the gap between cathode stripline 1 and plate 5 in the other figures, so as to give the same operation and performance. The gap could be located elsewhere, including sidewalls 7 and 8. Such an alternate location might be beneficial in some embodiments, such as one which uses an externally heated thermionic emitter cathode stripline. Such modifications would be obvious to one skilled in the art.

On the opposite phase of the applied microwave signal where the instantaneous RF electric field is suppressing electron emission from the cathode, the RF field loses more energy as the electrons travel from gate stripline 3 to plate 5 than was gained from cathode stripline 1 to gate 3. But the instantaneous total current density is reduced. Therefore, the time-averaged energy gained by the RF over a wave cycle is positive, and, as the signal propagates down the circuit, it grows. In addition, as the RF signal voltage grows on the gate stripline 3, the RF voltage grows proportionally between the cathode and gate stripline 1 and 3, due to coupling to the odd mode. The increased RF voltage increases the RF current emitted. This positive feedback attributes to the amplifier an exponential growth of the traveling wave and, therefore, a large and continuous gain.

Note that the amplifier of the present invention will amplify in both directions; i.e., it is symmetrical with the direction of wave propagation along the stripline. This places some extra requirements on matching the amplifier, as a reflected signal from the load will be amplified as it passes back through the amplifier to the input terminal. Circulators can be used to minimize this problem, and the art of achieving low reflection matches has advanced to a very high degree as well.

However, this two-way amplification process allows a reflection amplifier to be made with double the gain of a single pass amplifier. For example, a 10 dB gain single pass amplifier stage terminated by a reflection coefficient of unity (100% reflection) will have 20 dB total gain as a reflection amplifier. Since the output signal comes out at the input terminal as an amplified reflected signal, the output signal can be separated from the input signal by a circulator, as is well known in the art for diode-type reflection amplifiers, etc.

The fact, though, that the amplification mechanism of the present invention is actually a traveling-wave mechanism that works equally with waves in both directions and can work for waves that are any phase velocity, including speed of light or slower or faster waves, gives it a character similar to stimulated emission mediums of LASERs (and MASERS). That character can be further enhanced by biasing the gate stripline 3 with respect to cathode stripline 1 to a voltage that is below current emission of the emitter 2 of cathode stripline 1 or to a voltage that causes only small current emissions. This biasing is equivalent to the Class C and Class B biasing, respectively, of vacuum triodes and solid state transistors. Under this type of bias, no (or little) current is drawn until a microwave signal is applied that instantaneously causes the cathode to emit current. The microwave signal is amplified as before. In this mode of operation the amplifier of the present invention has a character even more similar to a stimulated emission medium. Not only can traveling-wave amplification take place in both directions, but no (or little) energy is consumed by the amplifier when no microwave signal is present. The application of a microwave signal causes energy to flow from the DC biased striplines to the microwave signal which is being amplified. The potential energy established by the DC bias supplies is then equivalent to the potential energy of the population-inverted medium established by an external pump source of a LASER; i.e., the biases of the striplines can be viewed as a population inversion.

It is due to the above described characteristics that the amplifier of the present invention could justly be named a "Stimulated Emission Stripline Traveling Wave Amplifier."

There are considerable differences between the present invention and the prior art of vacuum triode amplifiers. In a triode, the input signal is impressed on the grid circuit and the output amplified signal taken from a separate "plate" circuit. In the present invention there is no plate circuit. The input signal is injected on the gate stripline and the amplified output signal is taken from the gate stripline. The plates 5 and 6 are normally at RF ground potential and do not carry a signal. Obviously, an output signal taken from the grid of a triode would not be amplified.

The present amplifier has no "parasitic" capacitances to limit its frequency response. As a result, very high frequencies and very wide bandwidth operation can be achieved. Also, since there are no "parasitic" capacitances, the width of the striplines can be made large to achieve high power operation at high frequency. In addition, the power output is the result of a buildup or accumulation of power along the device. Hence, the power added to the wave per unit area can be low, resulting in the use of lower current density cathodes and lower power density collecting surfaces.

Figure 9:
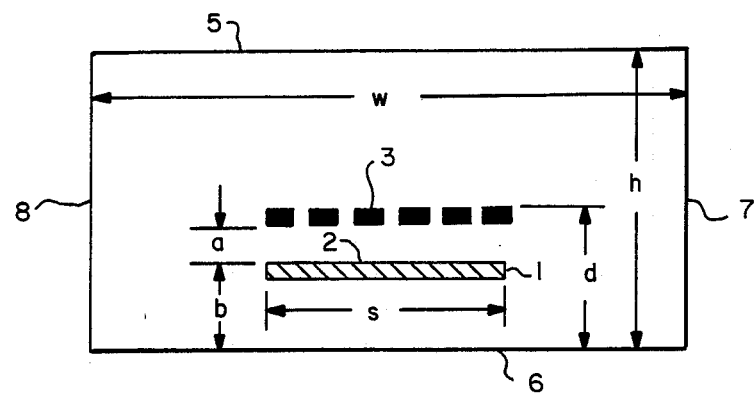
FIG. 9 is a schematic diagram showing the dimensions used in the analysis of the operation of the traveling wave stripline amplifier.

A calculation of gain is presented with reference to FIG. 9. For simplicity, assume that the effective $E_r$ dielectric constant for both the even and odd modes has been made $E_r$, that $h < w < < \lambda$ (all dimensions small comparted to a wavelength, that is, no higher order modes), $h < < s$ (strip spacings are small compared to their width), and that the RF electric field is uniform between the strips, but opposite direction above and below gate stripline 3 and equal magnitude between gate stripline 3 and cathode 1 and cathode 1 and plate 6, that is:

$$\vec{E} = E_2(z, t)\hat{y}, y > d$$

$$\vec{E} = -E_1(z, t)\hat{y}, y < d$$

where $y=0$ is taken at the surface of bottom plate 6. Also assume that transit time effects are negligible (i.e., the electrons traverse the device in a time short compared to the wave period of the microwave signal) and that no current is intercepted on gate stripline 3. For further simplicity, it will be assumed that the cathode strip is DC biased to an emitting condition (i.e., Class A operation) and that the microwave signal is of small amplitude (i.e., this is a small signal calculation). It is straightforward to one skilled in the art to extend these calculations to Class B or C operation and large signal amplitudes by taking the Fourier components of the nonlinear currents and voltages involved in such a case, and/or model the nonlinearities on a computer. It is also straightforward to one skilled in the art to perform actual computer simulations to obtain detailed performance.

All of these conditions assumed in the model are reasonable and valid for the amplifier of the present invention; however, it is to be understood that the amplifier of the present invention is not restricted to any of the stated conditions. Anyone skilled in the art can extend the calculations to be presented to conditions other than stated above, but these conditions are assumed here in order to keep the calculations presented simple and readily understood, yet informative enough to allow practical implementation.

To be general, suppose striplines 3 and 1 are DC biased such that the emitter surface 2 has an average DC emission current density of J. J is a function of voltage as can be seen from typical space charge limited and field emission cathode curves, FIGS. 10 and 11 respectively. Let the slope of J at the voltage bias point be slope m; i.e.:

$$m = \frac{dJ}{dV}$$

which is in units of $$\frac{\text{amperes}}{m^2 \text{ volts}}$$

Letting $\overline{V}_3$ represent the rms RF voltage from stripline 3 to plates 6 and 5, then the odd mode voltage, under the simple conditions assumed, is:

$$\overline{V} = \frac{a}{a+b} \overline{V}_3$$

the RF current density emitted from the cathode is:

$$\overline{J} = \frac{ma}{a+b} \overline{V}_3$$

The power per unit area added to the electrons from the RF between stripline 3 and stripline 1 is:

$$P_a = \overline{J}\overline{V}_o$$
$$= \frac{ma^2}{(a+b)^2} \overline{V}_3^2$$

Since the field is reversed above the stripline 3, then the power per unit area lost by the electrons to the RF for 100% transmission through gate stripline 3, is:

$$P_l = \overline{J}\overline{V}_3$$
$$= \frac{ma}{a+b} \overline{V}_3^2$$

If the gate stripline intercepts current, then:

$$P_l = T_r \left(\frac{ma}{a+b}\right) \overline{V}_3^2$$

where $T_r$ is the current transmission through gate stripline 3; e.g., $T_r = 0.90$ for 90% transmission of current.

Therefore, the net power per unit area added to the RF wave is:

$$P_{rf} = P_l - P_a$$
$$= \left[T_r \left(\frac{ma}{a+b}\right) - \frac{ma^2}{(a+b)^2}\right] \overline{V}_3^2$$

Note that if $b=0$ (cathode strip 3 connected to conducting plate 6), then $P_{rf}=0$ and there is no net interaction, even for $T_r$ at unity.

Since energy is power times time, then the RF energy per unit area added to the RF in dt time is:

$$\frac{dw}{dt} = \left[T_r \left(\frac{ma}{a+b}\right) - \frac{ma^2}{(a+b)^2}\right] \overline{V}_3^2$$

Also, the phase velocity:

$$V_p \frac{dz}{dt} = \frac{C}{\sqrt{E_r}}$$

so,

-continued $$dt = \frac{\sqrt{E_r}}{C} dz$$

Then:

$$\frac{dw}{dz} = \left[T_r \left(\frac{ma}{a+b}\right) - \frac{ma^2}{(a+b)^2}\right] \overline{V}_3^2$$

The energy stored per unit area in the RF field is:

$$W \simeq \tfrac{1}{2} E_o E_r \int_0^d \vec{E}_1 \cdot \vec{E}_1^* \, dy$$

Where $$\vec{E}_1 = \frac{\sqrt{2}}{a+b} \overline{V}_3 \hat{Y}$$

is the peak RF electric field. The assumption is made that most of the energy stored is between stripline 3 and stripline 1 and stripline 1 and plane 6, which will be normally true because of the dielectric loading and closer spacing. It is straight-forward to include the energy stored in the rest of the structure if significant. With these assumptions:

$$W \simeq \frac{E_o E_r \overline{V}_3^2}{a+b}$$

Now assume that the instantaneous form of the growing RF wave is:

$$V_{rf}(z,t) = \sqrt{2}\, \overline{V}_3 e^{\Gamma z + i(kz - wt)}$$

where $\sqrt{2}\, \overline{V}_3(o)$ is the peak voltage on gate stripline 3 at $Z=0$ (the input). Then the rms voltage on gate stripline 3 is:

$$\overline{V}_3(z) = \overline{V}_3(o) e^{\Gamma z}$$

Where $\Gamma$ is the growth rate to be determined. This analytical approach is well established and well known to those who are skilled in the art.

Now the energy stored per unit area at any point $Z$ along the stripline is:

$$W(z) = \frac{E_o E_r \overline{V}_3(z)^2}{a+b}$$
$$= \frac{E_o E_r \overline{V}_3^2(o) e^{2\Gamma z}}{a+b}$$

So:

$$\frac{dw(z)}{dz} = \frac{2\Gamma E_o E_r \overline{V}_3^2(o) e^{2\Gamma z}}{a+b}, \text{ and}$$

$$\frac{dw(z)}{dz} = \left[T_r \left(\frac{ma}{a+b}\right) - \frac{ma^2}{(a+b)^2}\right] \frac{\sqrt{E_r}}{C} \overline{V}_3^2(o) e^{2\Gamma z}$$

Since the two derivatives of energy per unit area must be equal, then:

$$\frac{2 \Gamma E_o E_r V_3^2(o)}{a + b} e^{2\Gamma z} =$$

$$\left[ Tr\left(\frac{ma}{a + b}\right) - \frac{ma^2}{(a + b)^2} \right] \frac{\sqrt{E_r}}{C} V_3^2(o) e^{2\Gamma z}$$

Solving for $\Gamma$ gives:

$$\Gamma = \frac{ma}{2 C \sqrt{E_r E_o}} \left[ Tr - \frac{a}{(a + b)} \right]$$

Now, since gain in dB (decibels):

$$G_{dB} = 20 \log_{10} e^{\Gamma L}$$

Where L is a length of amplifier:

$$G_{dB} = 8.686 \Gamma L$$
$$= 8.686 \frac{ma}{2C \sqrt{E_r E_o}} \left[ Tr - \frac{a}{a + b} \right] L$$

Note that if $b=0$, $GdB=0$ for Tr of Unity, and negative for $Tr<1$

Most emitters, including thermionic emitters, solid-state, photo-emission, etc. operate space charge limited. The Child-Langmuir law for space-charge limited flow between parallel surfaces is $$J_{sc} = \left(\frac{4 E_o}{9}\right)\left(\frac{2 e}{M_e}\right)^{\frac{1}{2}} (a^{-2}) V^{3/2}$$

Where $J_{sc}$ is the current density, $E_0$ the permittivity of vacuum, a spacing between the surfaces.

The parameter m in the gain equation is then $$m = \frac{d J_{sc}}{dV} = \left(\frac{4E_e}{9}\right)\left(\frac{2e}{M_2}\right)^{\frac{1}{2}} (a^{-2}) \frac{3}{2} V^{1/2}$$

If $a=5$ um and $V=1.0$ volt, then $$J_{sc} = 9.3 \times 10^4 \frac{\text{amperes}}{M^2}$$
$$= 9.3 \frac{\text{amps}}{\text{cm}^2}$$

A practical value for thermionic emitters and $$m = 1.4 \times 10^5 \frac{\text{amps}}{m^2 \text{ volt}}$$
$$= 14.0 \frac{\text{amps}}{\text{cm}^2 \text{ volt}} \text{ at 1 volt}$$

Suppose this emitter is used as the emitter 2 on stripline 1 for a 10 GHz amplifier with $h=20$ um, $a=b=5$ um, bias voltage 11 and 12 are 1 volt and 100 volts, respectively, $E_r \approx 1$ (minimal dielectric), $Tr=1$, then using the gain equation just derived $$G_{dB} \approx 5.7 \text{ dB}$$

per centimeter in length.

Hence, an amplifier having a total gain of 20 dB requires only about 3.5 cm of circuit length, which could easily be folded into a meander form and put into a 1 cm×1 cm×1 mm or smaller package.

Now suppose $a=1$ um and $V=1$ volt, then $$J_{sc} = 2.33 \times 10^6 \frac{\text{amps}}{m^2} = 233 \frac{\text{amps}}{\text{cm}^2} \text{ AND}$$

$$m = 3.5 \times 10^6 \frac{\text{amps}}{m^2 \text{volt}} = 350 \frac{\text{amps}}{\text{cm}^2 - \text{volt}}$$

An emission density of $$233 \frac{\text{amps}}{\text{cm}^2}$$

is too high for present thermionic emitters but can be achieved with solid-state and photoemission emitters.

Suppose this emitter is used as the emitter 2 on cathode stripline 1 in a 100 GHz amplifier where $h=5$ um, $a=b=1$ um, bias voltage 11 and 12 are 1 volt and 100 volts, respectively, and $E_r \approx 1$, $Tr=1$, then $$G_{dB} \approx 28.6 \text{ dB}$$

per centimeter length.

Note the extremely large gain per centimeter possible even at 100 GHz in the traveling-wave amplifier of the present Invention.

Field emission array cathodes operate well below the space charge limited current (current at which the electric field at the emitter drops to zero) due to the fact that a very strong electric field is required on the emission surface to draw the current out. The field emission array emitters are governed by the Fowler-Nordhiem equation which is of the form $$J_F = \frac{AF^2}{\theta} e^{-\frac{B\theta^{3/2}}{F}}, F = BV$$

This is a difficult equation to solve mathematically, as the parameters A, $\phi$, B, and F are complex functions of the geometry, materials, etc. However, using measured data such as from [2], to estimate $$m = \frac{dJp}{dv}$$

gives values of m that range from $$m \simeq 2 \frac{\text{amps}}{\text{cm}^2 \text{ volt}} \text{ at } 10 \frac{\text{amps}}{\text{cm}^2}$$

emission density ~60 volts bias, to $$m \simeq 15 \frac{\text{amps}}{\text{cm}^2 \text{ volt}} \text{ at } 200 \frac{\text{amps}}{\text{cm}^2}$$

emission density ~100 volts bias. Calculations using those numbers produce gains from ~0.5 dB/cm to ~3 dB/cm at frequencies up to 100 GHz. Although the gains are generally much lower for field emission emitters than for space charge limited emitters at the same current density, due to the much lower $m=dJ/dV$ values, field emitters still produce useful gain in the present invention.

It is possible, for some cathodes and gate stripline structures, that a bias voltage of opposite polarity as that illustrated in FIG. 1 (i.e., negative) is needed to bias the emission current to the desired level. Also, it is possible to have zero DC voltage bias 12 if the electrons are given sufficient acceleration from positive DC voltage bias 11 to traverse the gaps in the transit time required for the frequency.

Note that the dimension h, dimension s, or bias voltage 12, did not enter in this calculation of small signal gain. However, bias voltage 12 and dimension h largely determine the transit time for the electrons to traverse the device and these parameters must be selected to make the transit time small compared to the wave period, otherwise the gain will be reduced. The dimensions and voltages used in the above examples meet this condition.

The stripline width s does not determine the small signal gain per unit length of the amplifier because as the stripline width varies, so does the total emission current vary proportionally (assuming a continuous emitter surface on stripline 1) and the contribution of both variables to small signal gain cancel out leaving the small gain dependent only on stripline spacings, bias voltages, and emitter characteristics. However, stripline width and bias voltage 12 does affect the power output capability. The wider the stripline the larger the stripline current at a given RF voltage and the larger the power output can be in the large signal regime. Also, the power output capability increases with increasing bias voltage, as the peak RF amplitude can only increase to approximately the total DC acceleration bias voltages, 11 plus 12.

Figure 15:
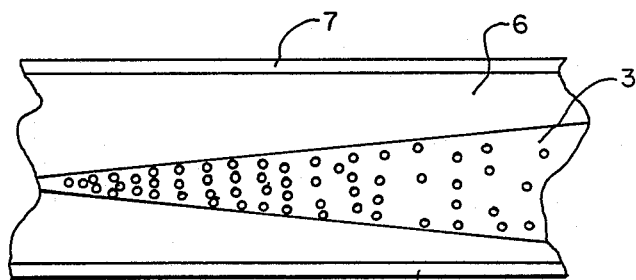
FIG. 15 shows a traveling wave device having tapered striplines.
Figure 16:
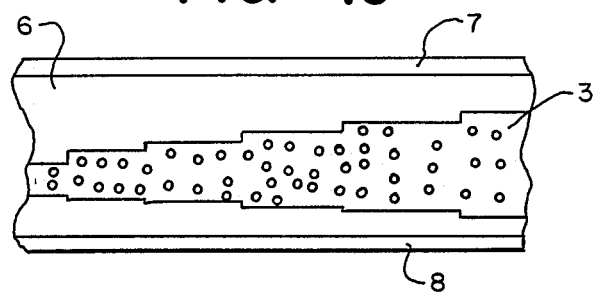
FIG. 16 shows a traveling wave device having stepped striplines.

It is well known in the art that as striplines are widened (as would be done in the present invention to obtain a higher power amplifier) the even and odd-mode impedances decrease. Therefore, for given stripline spacings, dielectric loadings, and bias voltages, a high power amplifier will generally have lower input and output impedance than a low-power amplifier. It is obvious, in this light, that a high gain amplifier of the present invention could have its striplines taper, continuously and smoothly or in discrete steps, from a narrow width (high impedance) at the low-power input end up to much wider striplines at the high power output end. This is schematically illustrated in FIGS. 15 and 16. Such a tapering could be done such that the RF voltage is approximately constant and near saturation throughout the amplifier, thereby forming an amplifier with very high overall efficiency. For example, an amplifier with a 50 ohm input impedance and an input RF signal voltage of 7.07 volts rms would have an input power of 1 watt. If the output of the amplifier is 5 ohms with a signal voltage of 7.07 volts rms (striplines tapered) then the output power is 10 watts for a power gain of 10 dB. Note that the tapering is done to improve amplifier efficiency and power output, not bandwidth. Tapering or stepping in stripline spacings and/or applied voltages would provide similar and/or additional benefit.

An amplifier of the present invention tapered as described above would have a reduced backward gain relative to the forward gain in the near saturation condition, simply because a signal traveling from the low impedance end to the high impedance end could not grow to a high power level because of the lower power saturation level at the high impedance end.

In addition, although the calculations performed here are for small signal Class A type of operation, bias voltage 11 could be adjusted for Class B or Class C types of operation, which would be advantageous in terms of increased efficiency, just as in a simple vacuum triode or solid state transistor. To make these types of calculations, one need only to include the Fourier fundamental and harmonic frequency components of the currents and voltages involved to obtain the fundamental and harmonic gains and outputs.

These details are not addressed any further here as no additional understanding of the present invention is gained and one skilled in the art in light of the principles taught here, can readily extend the calculations to obtain these performances.

Due to the very wideband capability of the amplifier of the present invention (because a simple TEM circuit is used rather than a periodic slow-wave circuit which has very limited bandwidth) harmonic output frequencies of the fundamental input frequency can be produced. To enhance such operation, the transit time of the electrons in the amplifier must be made small compared to the wave period at the desired harmonic and the amplifier should be operated in a very nonlinear regime such as in Class C. Under those conditions, harmonics can be generated and amplified to produce strong harmonic output. Such a device is useful as a frequency multiplier to achieve very high frequencies where fundamental sources are not available.

For some applications, it is desired to suppress harmonics to a low level. In that case, the amplifier should be operated as linear as possible (small signal class A), and/or the transit line should be adjusted to suppress wave growth at the undesired harmonic frequencies, and/or low-pass filtering should be applied at the output or within the amplifier structure itself, and/or dispersion can be added to the stripline circuit to unbalance the even and odd mode phase velocities at the harmonic frequencies. Such techniques to enhance or suppress harmonics are many and would be obvious to one skilled in the art in light of the present teachings.

Although discussions so far have generally centered on FIGS. 1, 2, 9, 10 and 11, which are applicable to all types of emitters as used in the present invention, it is now desirable to discuss particular emitters and their implementation in the present invention. It is the intention in this disclosure to illustrate how emitters of many different types can be used to form the emission surface 2 of cathode stripline 1.

Figure 3:
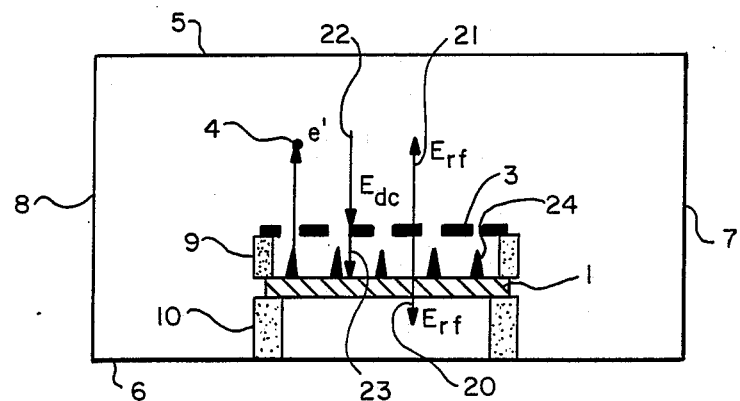
FIG. 3 is a cross-section of another embodiment of the present invention having a field emission type of emitter.

FIG. 3 illustrates schematically how a general field emission array of sharp tips could be used. The tips 24 may be metal or semiconductor and mounted on a metal or semiconductor base which forms cathode stripline 1. The cathode stripline is supported by dielectric supports 10 which may be strips, posts, solid, etc., or any other form, as long as it is dimensionally stable enough to support the striplines. Over the cathode stripline, and with apertures formed in a pattern to match the field emitter tip array, is the gate stripline 3.

The gate stripline 3 can be supported by strip dielectrics 9 at the edge as shown, or with more strip dielectrics or posts or with a solid dielectric formed with apertures in the same pattern as the field emitter tip array stripline and gate stripline. Suitable dielectrics have been discussed previously.

FIG. 4 illustrates schematically the use of a particularly successful field emitter array developed by C.H. Spindt, et al., Field Emission Array Development, 33rd International Emission Symposium, July 1986. In this case, the substrate for cathode stripline 1 is heavily doped silicon for good conductivity, the support dielectric 10 is nearly pure silicon for good dielectric properties, the gate stripline 3 is a thin film of ½ μm molybdenum in which an array of holes 1 μm, diameter is formed, support dielectric 9 is 1 μm thick $S_iO_2$ formed in the same hole pattern as the gate stripline, and molybdenum cones with their base on the silicon substrate 1 and emitter tips 2 near the plane of the molybdenum gate film stripline 3.

FIG. 5 shows a practical implementation with a thermionic emitter. Since the thermionic emitter surface 25 must be heated to at least 800 degrees C. or more for thermionic emission, the cathode stripline 1 is a thin film of high temperature metal such as molybdenum, nickel, tungsten, etc. of sufficient resistance to enable it to be heated when a current is passed through it, longitudinally along the length of the stripline. This current can be DC or low frequency AC. The connections at the ends of the cathode stripline for this heater current require RF chokes to prevent loss of RF through the heater connections. The gate stripline 3 can be of many forms, E.g., grid of wires or array of apertures, etc., as discussed previously. They can be supported via dielectric strips 9 or solid dielectric with the same array of apertures as the gate stripline, etc. Since the dielectrics and gate material also are near cathode temperature, they need to be made of high temperature materials such as alumina, beryllia, etc. and molybdenum, etc., respectively. The gate stripline, being hot, would need an electron suppression coating to prevent the gate from becoming an emitter. Such technology is well known in the art of grids for thermionic vacuum tubes of all types. Since the cathode stripline is hot, a long thermal path for support is needed for thermal isolation. FIG. 5 shows the stripline system supported by a wide thin dielectric from the sidewalls 7 and 8 to increase the thermal path. Alternately, the emitter could be heated via an external heater connected to plate 6 with heat conduction through dielectric support 10 to heat the cathode stripline 1.

FIG. 6 shows an implementation of the present invention using a semiconductor emitter as the emitter 2. Semiconductor emitters can be of the form of an n-p diode junction where the diode is forward biased and carriers injected across the junction from n-layer 31 travel through the very thin p-layer 33 and out of the surface into a vacuum. Generally, a material such as Cessium is added to the surface in a mon-atomic layer to lower the surface work function. Such cathodes have achieved hundred of $$\frac{amps}{cm2}$$

emission density, but require a very good vacuum, see R.L. Bill Negative Electron Affinity Devices, chapter 8, Claridon Press, Oxford, England 1973.

Another type of semiconductor cold cathode is also a diode junction but of a p-n type in which the n-layer is very thin, the diode in reverse biased into avalanche breakdown, and electrons travel through the very thin n-layer into vacuum. Cessium is also generally applied to the surface in a mon-atomic layer to lower the work function, see G.G.P. VanGorkan, An Efficient Silicon cold Cathode For High Current Densities, Phillips Research Journal, Vol. 39, 1984.

Still another type of emitter is the photoemitter. Photoemission cathodes have been made that can produce $$\sim 200 \frac{amps}{cm2}$$

or more emission density, see C.K. Sinclair, Photoemission Cathode Development at Stanford Linear Accelerator Center, Tri Valley Workshop, Washington, D.C., but they require an external light source such as a laser and a means of entering the tube through a vacuum window. This emitter adds great complexity. However, a type of photoemission emitter that is practical is one in which a thin photoemitter material is deposited over a solid-state thin film light emitting diode, see R.L. Bill above.

Figure 8:
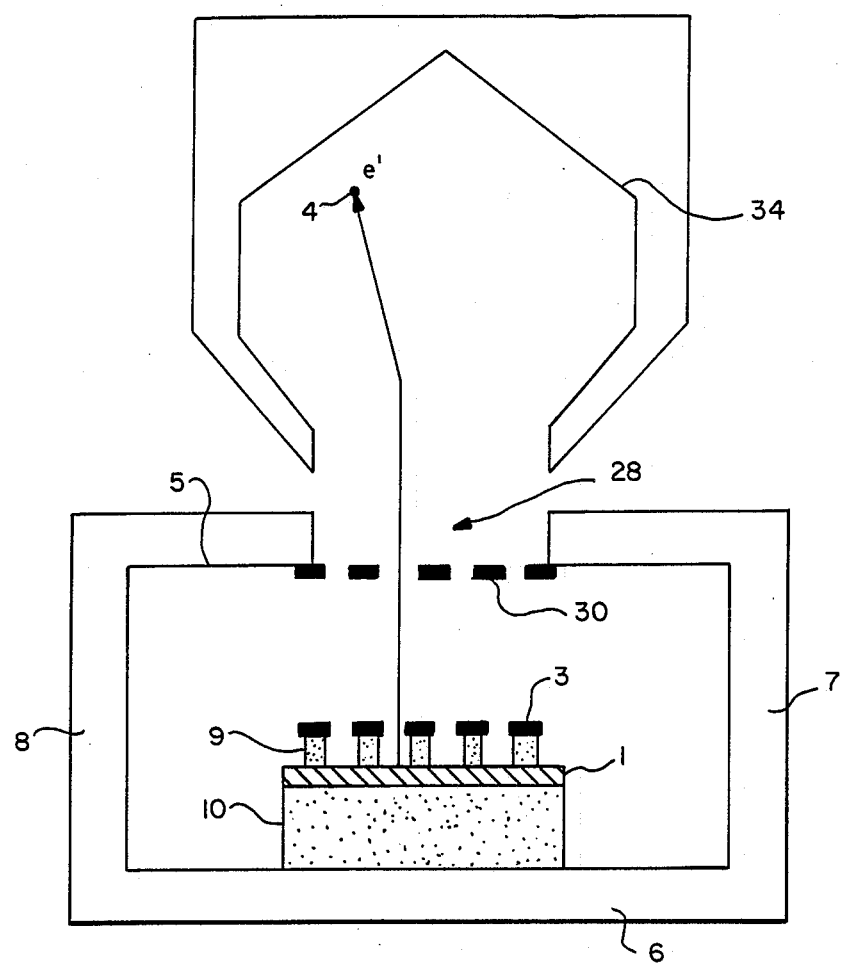
FIG. 8 is a schematic illustration of an embodiment of the present invention which includes a separate collector for high power operation.

All of the emitters described are suitable for use in the present invention as well as many that have not been described. However, so far only the very simple general configuration of striplines between flat conducting plates has been discussed in association with FIGS. 1 to 6 and 9. This geometry is the simplest but not restrictive. FIG. 7 shows the striplines 1 and 3 supported between the ridges of a double-ridged waveguide. The operation is the same. FIG. 8 shows operation with an axial slit 28 in the conducting plate 5 to allow exit of the electron current into a large collector 34 which can be depressed to allow energy recovery of the electrons to increase overall efficiency. The separate collector also allows very much larger powers to be achieved than without it, particularly with the high density emitters discussed. For minimum transit time a second grid 30 would be beneficial. This grid could be supported with a dielectric between grid 30 and gate stripline 3 in the same aperture pattern as stripline 3.

Figure 12:
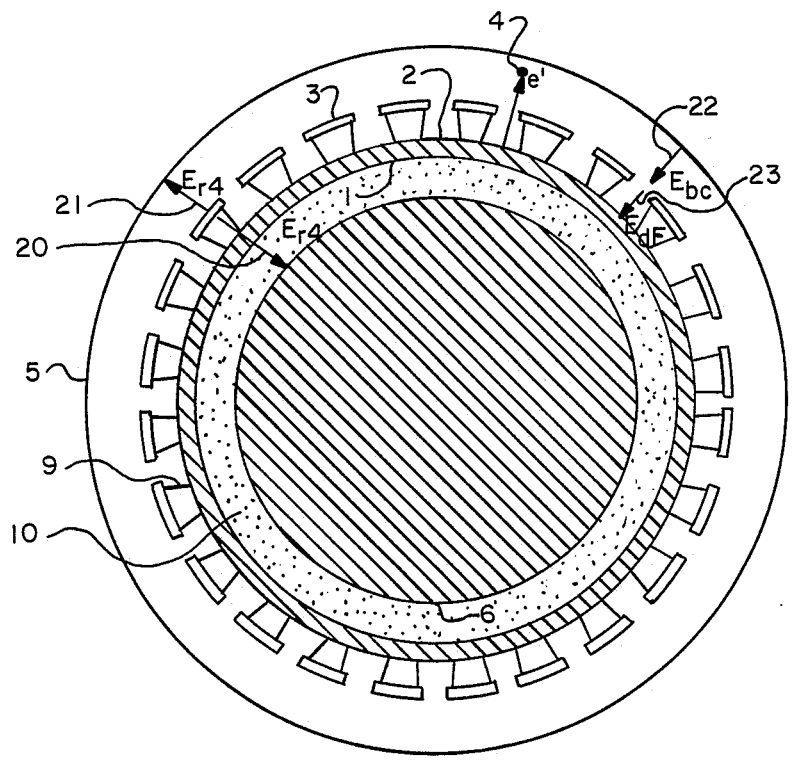
FIG. 12 is schematic illustration of an amplifier in accordance with the present invention implemented in a coaxial configuration.

The present invention need not be restricted to a planar geometry. FIG. 12 shows a cylindrical coaxial configuration in which any emitter can be used as before. The center structure can be supported with dielectric strips, etc. from the walls of the outer cylinder or from the ends oat the input and output connectors.

FIG. 13 illustrates the side view of an oscillator formed with a quarter wave section of amplifier. At one end of the section, the striplines are RF shorted to RF ground by capacitors 35 and 36. The other end of gate stripline 3 is weakly coupled to the output load or transmission line by capacitor 37. Other methods of coupling, as by probes, loops, waveguides, etc., are numerous and obvious to one skilled in the art. Thus so connected, the section forms a quarter wavelength stripline resonator and therefore supports a standing wave. The emitter 2 and gate stripline sections need not cover the entire length of λ/4 line and is preferably just applied to the high RF voltage end of the resonator. Hence, the remainder of the stripline need only be striplines 38 and 39. Not shown in FIG. 13 are the dielectric support for the striplines. Bias voltages 11 and 12 are applied though choke 16 and 17 as before. If emitter 2 is a thermionic emitter then cathode stripline 1 is heated by passing a DC or low frequency AC current, illustrated by DC source 41, through chokes 40 and 17. Since the standing wave is composed of oppositely traveling waves, which are amplified by the emitting section, the system can support self-sustaining oscillations at its resonant frequency. Other resonator and cavity systems would be obvious to one skilled in the art.

FIG. 17 is a schematic illustration of a photoemitter cathode stripline 1A including a light source 42. The energy from the light source 42 causes emission of electrons from the photoemitter cathode stripline. The reference numbers applied to other parts have been previously described in connection with like parts in FIGS. 1-3. FIG. 18 shows the light emitting source 43 constructed as part of the cathode stripline 1. Again, like reference numbers have been applied to like parts previously described in connection with FIGS. 1-3.

FIG. 19 is a schematic top view of a reflection amplifier with a gate stripline 3. The output is terminated by a high reflection termination to provide high reflection. Input circulator 48 introduces r.f. signal to the line 3 and extracts reflected r.f. signal.

FIG. 20 shows a traveling wave device in which the spacing between the electron source and the gate stripline 3 is tapered.

FIG. 21 shows a traveling wave device connected to a filter 52 which selects a particular harmonic frequency.

Obviously, numerous additional modifications and variations of the present invention are possible in light of the above teachings. It is therefore to be understood that within the scope of the appended claims, the present invention may be practiced otherwise than as specifically described herein.

We claim:

1. A stripline traveling wave device comprising
a cathode stripline including means for ejecting electrons from one surface thereof in response to applied electric fields,
a conducting plate insulated from and disposed opposite and spaced from said one surface,
a second conductive means insulated from and disposed to electrically cooperate with the opposite surface of said cathode stripline,
a gate stripline insulated from and disposed between said conducting plate and said cathode stripline and serving to propagate r.f. signals applied thereto with r.f. electric fields extending in opposite directions between said gate stripline and conducting plate and between said gate stripline and cathode stripline and second conductive means whereby the r.f. voltage between said gate stripline and conducting plate is greater than the r.f. voltage between said gate stripline and cathode stripline, and
means for applying a DC voltage in the same direction between said conducting plate and gate stripline and between the gate stripline and the cathode stripline to accelerate electrons ejected from said cathode to said conducting plate, said gate stripline being constructed for minimum interception of electrons, said electrons traveling through the gate stripline to the conducting plate interacting with the r.f. electric fields to transfer energy to the r.f. propagating signals.

2. A stripline traveling-wave device as in claim 1, wherein: the r.f. propagating signals are comprised of a coupled even mode and an odd mode, where the even mode is the r.f. field component from the gate striplines to the conducting plate, and the odd mode is the r.f. field component between the cathode stripline and the gate stripline, said odd mode serving to modulate the electron current, and when the r.f. propagating signals are amplified by said modulated electron current the said coupled odd mode is amplified also, which in turn amplifies said modulated electron current, thereby forming a positive feedback system with high traveling-wave gain.

3. A stripline traveling-wave device as in claim 1 in which said r.f. electric fields also serve to stimulate and/or enhance electron emission from the cathode stripline.

4. A stripline traveling-wave device as in claim 2 in which the r.f. electric fields also serve to stimulate and/or enhance electron emission from the cathode stripline.

5. A stripline traveling-wave device as in claims 1, 2, 3 or 4 in which the electron emitter of the said cathode stripline is a thermionic type of emitter.

6. A stripline traveling-wave device as in claims 1, 2, 3 or 4 in which the electron emitter of the said cathode stripline is a field-emission emitter.

7. A stripline traveling-wave device as in claims 1, 2, 3 or 4 in which the electron emitter of the said cathode stripline is a "Spindt" field-emission array comprised of molybdenum tips on a highly doped and conducting silicon substrate where the tips are in the plane of a thin film molybdenum gate stripline supported by a silicon dioxide dielectric film.

8. A stripline traveling-wave device as in claims 1, 2, 3 or 4 in which the electron emitter of the said cathode stripline is a field-emission array of metal tips.

9. A stripline traveling-wave device as in claims 1, 2, 3 or 4 in which the electron emitter of the said cathode stripline is a field-emission array of semiconducting tips.

10. A stripline traveling-wave device as in claims 1, 2, 3 or 4 in which the electron emitter of the said cathode stripline is a solid-state diode junction type of emitter.

11. A traveling-wave device as in claims 1, 2, 3 or 4 in which the electron emitter of the said cathode stripline is a photoemitter in which the light is supplied from an external source.

12. A traveling-wave device as in claims 1, 2, 3 or 4 which is terminated at one end with a high coefficient of reflection termination and a circulator is connected to introduce r.f. signal into the device and to extract reflected and amplified output r.f. signal traveling in the opposite direction.

13. A traveling-wave device as in claims 1, 2, 3 or 4 in which the said striplines are tapered in width to improve the efficiency and power output.

14. A traveling-wave device as in claims 1, 2, 3 or 4 in which the spacing between striplines is tapered to improve efficiency and power output.

15. A traveling-wave device as in claims 1, 2, 3 or 4 in which the width and spacing of the striplines is tapered to improve efficiency and power output.

16. A traveling-wave device as in claims 1, 2, 3 or 4 in which the dimensions and bias voltages are optimized for use as a harmonic frequency generator and/or amplifier of a harmonic or harmonics of a fundamental frequency input signal.

17. A traveling-wave device as in claims 1, 2, 3 or 4 in which the dimensions and bias voltages are optimized to minimize harmonic frequency generation.

18. A traveling-wave device as in claims 1, 2, 3 or 4 in which the dimensions and bias voltages are optimized to minimize harmonic frequency generation and which also includes frequency filtering circuitry to further minimize harmonic frequency generation.

19. A traveling-wave harmonic frequency generator as recited in claims 1, 2, 3 or 4 in which the dimensions and bias voltages are optimized for use as a harmonic frequency generator and/or amplifier of a fundamental frequency input signal and which also includes frequency filtering circuitry to select a particular harmonic or harmonics.

20. A traveling-wave device as in claims 1, 2, 3 or 4 in which the conducting plate toward which the electrons are accelerated is used as the electron collector.

21. A traveling-wave device as in claims 1, 2, 3 or 4 in which the said conducting plate toward which the electrons are accelerated passes said electrons, and a separate collector is disposed to receive the electrons.

22. A traveling-wave device as in claim 21 in which the said separate collector is biased at a negative voltage with respect to the said conducting plate, or contains negatively biased electrodes, for the purpose of recovering energy from the electrons to improve the overall amplifier efficiency.

23. A traveling-wave device as in claims 1, 2, 3 or 4 in which said second conductive means comprises a conductive plate disposed opposite and spaced from the other surface of the cathode stripline.

24. A stripline traveling-wave device as in claims 1, 2 or 3 including a portion which is formed to provide a standing wave structure.

25. A traveling-wave device as in claims 1, 2, 3 or 4 in which the electron emitter of the said cathode stripline is a photoemitter in which the light is supplied from a light emitting source constructed as part of said cathode stripline.

* * * * *

UNITED STATES PATENT AND TRADEMARK OFFICE
CERTIFICATE OF CORRECTION

PATENT NO. : 4,967,162

DATED : October 10, 1990

INVENTOR(S) : Larry R. Barnett, et al.

It is certified that error appears in the above-identified patent and that said Letters Patent is hereby corrected as shown below:

In column 3, line 32, replace "cathode stripline which" with --cathode stripline 1 which--; line 55, replace "now" with --not--.

In column 4, line 56 to 57, replace "between the gate stripline 3 and the plates 5 and 6" with --of the two striplines 1 and 3--; lines 58 to 59, replace "between the gate stripline 3 and the plates 5 and 6" with --of the two striplines 1 and 3--.

In column 5, line 18, replace "$E_r$" with --$\epsilon_r$--; line 30, replace "$E_{re}$" with --$\epsilon_{re}$--; line 31, replace "$E_{ro}$" with --$\epsilon_{ro}$--; line 34, replace "$E_{re} = E_{ro}$" with --$\epsilon_{re} = \epsilon_{ro}$--; line 48, replace "$E_r$" with --$\epsilon_r$--; line 50, replace "$E_r$" with --$\epsilon_r$--.

In column 6, line 33, replace "cathode stripline 3" with --cathode stripline 1--.

In column 8, line 15, replace "$E_r$" with --$\epsilon_r$--; line 17, replace "$E_r$" with --$\epsilon_r$--.

In column 9, line 10, replace "$\tilde{V}$" with --$\tilde{V}_o$--; line 21, replace "Pa" with --$P_a$--; line 41, replace "Tr" with --$T_r$--; line 42, replace "Tr" with --$T_r$--; line 49, replace "Tr" with --$T_r$--; line 59, replace "dw" with --dW--; line 65, replace "$E_r$" with --$\epsilon_r$--.

In column 10, line 2, replace "$E_r$" with --$\epsilon_r$--; line 8, replace "dw" with --dW-- and replace "Tr" with --$T_r$--; line 14, replace "$E_o E_r$" with --$\epsilon_o \epsilon_r$--; line 32, replace "$E_o E_r$" with --$\epsilon_o \epsilon_r$--; line 39, replace "$V_3$" with --$V_3(0)$--; line 53, replace "$E_o E_r$" with --$\epsilon_o \epsilon_r$--; line 56, replace "$E_o E_r$" with --$\epsilon_o \epsilon_r$--; line 60, replace "dw" with --dW-- and replace "$E_o E_r$" with --$\epsilon_o \epsilon_r$--; line 64, replace "dw" with --dW--, "Tr" with --$T_r$-- and "$E_r$" with --$\epsilon_r$--.

UNITED STATES PATENT AND TRADEMARK OFFICE
CERTIFICATE OF CORRECTION

PATENT NO. : 4,967,162

DATED : October 10, 1990

INVENTOR(S) : Larry R. Barnett, et al.

Page 2 of 2

It is certified that error appears in the above-identified patent and that said Letters Patent is hereby corrected as shown below:

In column 11, line 2, replace "$E_o E_r$" with --$\epsilon_o \epsilon_r$--; line 6, replace "$E_r$" with --$\epsilon_r$-- and replace "Tr" with --$T_r$--; line 12, replace "Tr" with --$T_r$--; line 13, replace "$E_o E_r$" with --$\epsilon_o \epsilon_r$--; line 24, replace "Tr" with --$T_r$--; line 25, replace "$E_o E_r$" with --$\epsilon_o \epsilon_r$--; line 27, replace "GdB=0 for Tr" with --$G_{db}$=0 for $T_r$--; line 28, replace "Tr" with --$T_r$--; line 35, replace "$E_o$" with --$\epsilon_o$--; line 38, replace "$E_o$" with --$\epsilon_o$--; line 43, replace "$E_e$" with --$\epsilon_e$-- and replace "$2_e$" with --2e--; line 44, replace "$M_2$" with --$M_e$--; line 65, replace "Tr" with --$T_r$--.

In column 12, line 42, replace "B$\theta$" with --B$\phi$--; line 43, replace "$\theta$" with --$\phi$--; line 25, replace "Tr" with --$T_r$--.

In column 15, line 10, replace "tips 2" with --tips 26--.

In column 17, line 6, replace "1" with --1A--.

In the Claims:
In column 17, line 61, replace "gate" with --gate and cathode--.

Signed and Sealed this

Thirteenth Day of October, 1992

*Attest:*

DOUGLAS B. COMER

*Attesting Officer*        *Acting Commissioner of Patents and Trademarks*